United States Patent
Huang et al.

[11] Patent Number: 5,994,183
[45] Date of Patent: Nov. 30, 1999

[54] METHOD FOR FORMING CHARGE STORAGE STRUCTURE

[75] Inventors: Kuo-Tai Huang, Hsinchu; Wen-Yi Hsieh, Taipei; Tri-Rung Yew, Hsinchu Hsien, all of Taiwan

[73] Assignee: United Microelectronics Corp., Taiwan

[21] Appl. No.: 08/996,696

[22] Filed: Dec. 23, 1997

[30] Foreign Application Priority Data

Oct. 18, 1997 [TW] Taiwan ................................. 86115361

[51] Int. Cl.$^6$ ....................... H01L 21/8242; H01L 27/108
[52] U.S. Cl. ...................... 438/256; 438/399; 257/303; 257/306
[58] Field of Search ..................................... 438/618, 626, 438/385, 241, 453, 255, 253, 396, 250, 238, 243, 256, 389, 399; 257/306, 412, 773, 301; 365/149; 357/71, 236; 427/255.2

[56] References Cited

U.S. PATENT DOCUMENTS

| | | | |
|---|---|---|---|
| 4,918,502 | 4/1990 | Kaga et al. | 357/23.6 |
| 4,984,030 | 1/1991 | Sunami et al. | 357/23.6 |
| 5,025,741 | 6/1991 | Suwanai et al. | 438/385 |
| 5,049,975 | 9/1991 | Ajika et al. | 357/71 |
| 5,187,566 | 2/1993 | Yoshikawa et al. | 257/301 |
| 5,192,713 | 3/1993 | Harada | 438/453 |
| 5,234,859 | 8/1993 | Mametani et al. | 438/250 |
| 5,309,023 | 5/1994 | Motonami et al. | 257/773 |
| 5,380,673 | 1/1995 | Yang et al. | 438/396 |
| 5,393,565 | 2/1995 | Suzuki et al. | 427/255.2 |
| 5,413,950 | 5/1995 | Chen et al. | 438/253 |
| 5,471,418 | 11/1995 | Tanigawa | 365/149 |
| 5,480,837 | 1/1996 | Liaw et al. | 438/626 |
| 5,539,231 | 7/1996 | Suganaga et al. | 257/306 |
| 5,712,194 | 1/1998 | Kanazawa | 438/618 |
| 5,747,845 | 5/1998 | Iwasa | 257/306 |
| 5,759,889 | 6/1998 | Sakao | 438/241 |
| 5,789,290 | 8/1998 | Sun | 438/253 |
| 5,837,579 | 11/1998 | Huang | 438/255 |
| 5,838,051 | 11/1998 | Yen et al. | 257/412 |

*Primary Examiner*—Donald L. Monin, Jr.
*Assistant Examiner*—Bernard E. Souw
*Attorney, Agent, or Firm*—Rabin & Champagne, PC

[57] ABSTRACT

A method for forming a high capacitance charge storage structure that can be applied to a substrate wafer having MOS transistor already formed thereon. The method is to form an insulating layer above the substrate wafer. Next, a contact window exposing a source/drain region is formed in the insulating layer. Then, a tungsten suicide layer, which functions as a lower electrode for the charge storage structure, is formed over the substrate. Thereafter, a tungsten nitride layer is formed over the tungsten silicide layer, and then a dielectric layer is formed over the tungsten nitride layer. The dielectric layer is preferably a tantalum oxide layer. Finally, a titanium nitride layer, which functions as an upper electrode for the charge storage structure, is formed over the tantalum oxide layer.

14 Claims, 1 Drawing Sheet

1

METHOD FOR FORMING CHARGE STORAGE STRUCTURE

BACKGROUND OF THE INVENTION

1. Field of Invention

The present invention relates to a method for forming a charge storage structure. More particularly, the present invention relates to a method for forming DRAM's charge storage structure.

2. Description of Related Art

In most dynamic random access memory (DRAM), data is usually stored in an array of capacitors on a semiconductor wafer. In general, a capacitor that is able to discharge is referred to as in a logic "1" state, while a capacitor that needs to be charged is referred to as in a logic "0" state. Hence, a bit of binary data is stored in each capacitor.

Normally, a capacitor having a high charge storage capacity is greatly desired. In other words, a capacitor with a high capacitance is very much in demand. The capacitance of a capacitor is largely determined by the separation between the top and the bottom electrodes. Since there is a dielectric layer between the top and the bottom electrodes, the distance of separation is determined by the thickness of the dielectric layer. Therefore, when the dielectric layer is made very thin, a higher capacitance is obtained.

Another factor that affects the capacitance of a capacitor is the dielectric constant of the material used to fabricate the dielectric layer. Charge storage capacity can be increased simply by using a material having a high dielectric constant.

Although dielectric thickness and dielectric constant are two main factors affecting the capacitance, some other factors will also affect the capacitance of a capacitor indirectly. One of these factors is related to properties of the selected dielectric material, for example, the charge leakage rate through the dielectric material and the breakdown voltage of the dielectric material. In mass production of capacitors, charge leakage and voltage breakdown not only will be related to the dielectric material used, but also will be affected by the quality of dielectric thin film produced. For example, if the thin dielectric film contains pinhole structure leading to a charge leakage, then the quality of the dielectric material in a DRAM capacitor is consider poor. Similarly, if the dielectric material has a low breakdown voltage, then the dielectric material can only be used for devices in low voltage operation.

In recent years, attempts have been made to increase the dielectric constant of dielectric material used in a DRAM capacitor, for example, such material includes tantalum oxide ($Ta_2O_5$). Tantalum oxide has a dielectric constant of about 25, whereas silicon dioxide ($SiO_2$) has a dielectric constant of only about 3.9. However, the conventional method of forming a tantalum oxide thin film often leads to non-uniformity of quality and unstable dielectric constant. In addition, during the deposition of tantalum oxide, a native oxide may be grown in between the polysilicon electrode and the tantalum oxide layer that frequently leads to non-uniformity in the tantalum oxide layer, and a lowering of the dielectric constant. If annealing operation is performed one or several times in an atmosphere with oxygen, then leakage current from the tantalum oxide layer will be reduced. Furthermore, oxygen vacancy and other abnormalities of a thin film can be reduced as well. However, annealing will help the oxygen atom diffuse through the tantalum oxide, and oxidizing the polysilicon electrode beneath the tantalum oxide layer.

2

In view of the above problems, when the dielectric material such as tantalum oxide is deposited, native oxide on the polysilicon electrode surface of a wafer must be removed or its original growth limited. One method of removing the native oxide layer from the surface of the polysilicon electrode includes using a wet etching method. However, this method is difficult to remove the native oxide layer completely. Moreover, when there is a transfer of wafer from one reaction chamber to another, probability of reforming the native oxide is high.

In light of the foregoing, there is a need in the art an improved method for forming a charge storage structure.

SUMMARY OF THE INVENTION

Accordingly, the present invention is directed to provide a capacitor storage structure that can prevent the lowering of dielectric constant due to the growth of a native oxide layer. Furthermore, an additional barrier layer is formed on the surface of the lower electrode to reduce the probability of oxygen diffusing into the lower electrode and enabling an oxide layer to grow there. With this arrangement, an increase capacitance and a lower leakage current is obtained.

To achieve these and other advantages and in accordance with the purpose of the invention, as embodied and broadly described herein, the invention provides a method for forming a charge storage structure comprising the steps of providing a substrate wafer having MOS transistor already formed thereon, then forming an insulating layer over the substrate wafer. Next, using photolithographic and etching processes, the insulating layer is patterned to form a contact window exposing a source/drain region in the substrate. Thereafter, a metal silicide layer is formed above the insulating layer and the contact window, wherein the metal silicide layer is tungsten silicide, which serves as the lower electrode of the charge storage structure. A first metal nitride layer is formed over the metal silicide layer, then a dielectric layer is formed over the first metal nitride layer. Finally, a second metal nitride layer is formed over the dielectric layer, wherein the second metal nitride layer serves as the upper electrode of the charge storage structure. The first metal nitride, the dielectric layer and the second metal nitride layer are respectively tungsten nitride, tantalum oxide and titanium nitride. Because a tungsten nitride barrier layer is formed over the tungsten silicide lower electrode, the formation of a silicon oxide layer on the surface of the tungsten silicide surface can be prevented. Consequently, the capacitance of such charge storage structure is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
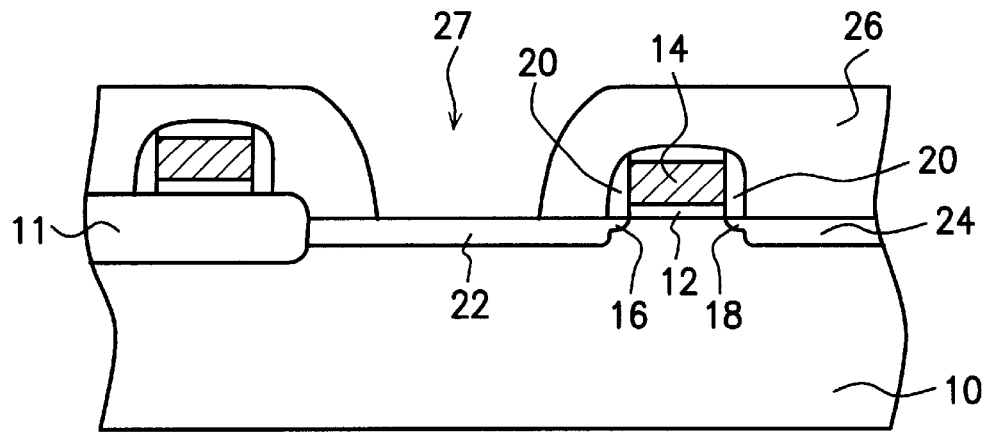
FIGS. 1A through 1C are cross-sectional views showing the progression of manufacturing steps in forming a charge storage structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
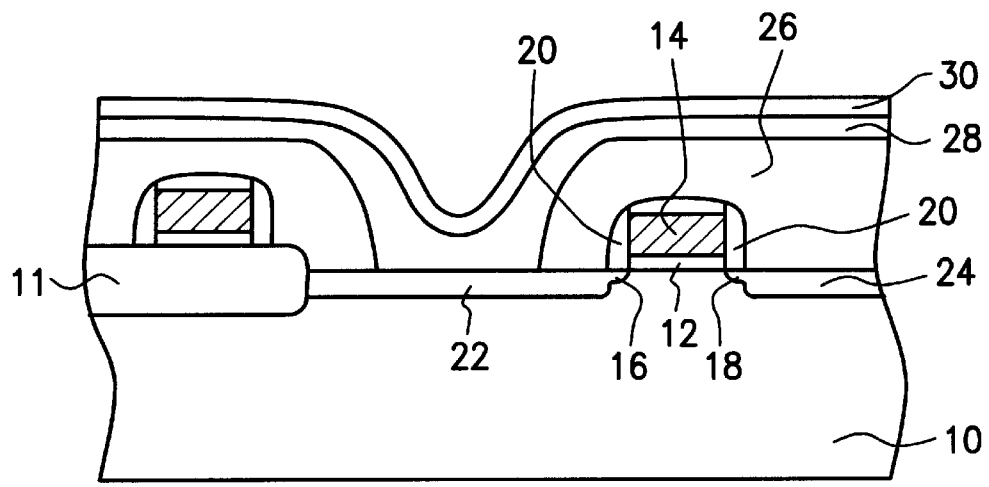
Figure 1C:
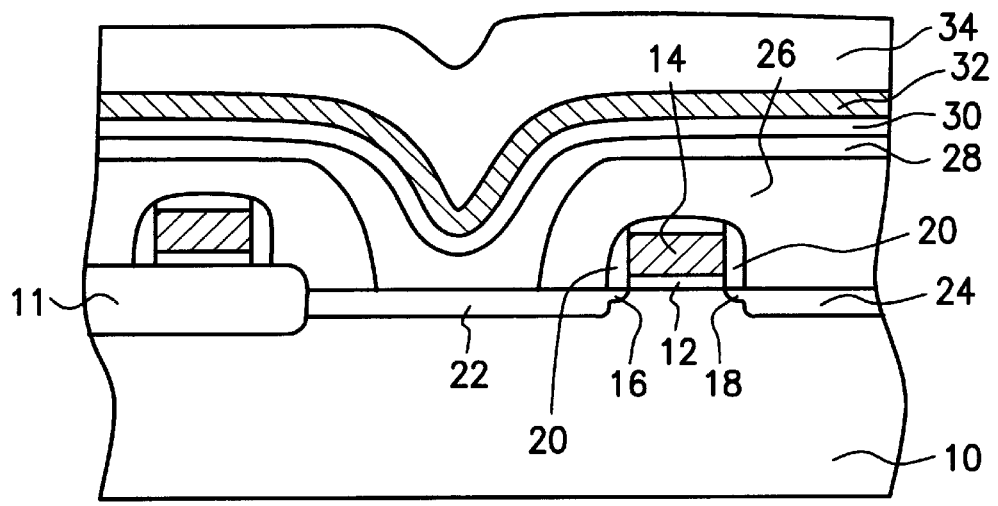

FIGS. 1A through 1C are cross-sectional views showing the progression of manufacturing steps in forming a charge storage structure according to one preferred embodiment of this invention.

First, as shown in FIG. 1A, a MOS transistor is formed over a P-type substrate 10. The substrate 10 also includes a thick field oxide region, which serves to isolate the MOS transistor from neighboring transistor. Conventionally, a device isolation structure 11 is formed by a local oxidized silicon (LOCOS) method or any variation of a LOCOS method. However, device isolation can also be obtained by etching a trench in the substrate. Then, an insulating layer is deposited into the trench, wherein the insulating layer can be an oxide layer, for example, formed by using a chemical vapor deposition (CVD) method. Thereafter, a gate oxide layer 12 is formed between the device isolation structures 11 in the active device region using a thermal oxidation method. In a subsequent step, a polysilicon gate electrode 14 is formed above the gate oxide layer 12. In general, the polysilicon gate electrode 14 is formed by depositing an undoped polysilicon layer over the substrate. Then, impurities are implanted while the polysilicon is being deposited using a low pressure chemical vapor deposition (LPCVD) method. Finally, an annealing is carried out to activate the impurities making the polysilicon gate layer conductive.

Next, impurities are doped on the sides of the polysilicon gate electrode forming source/drain regions 16 and 18 in the substrate, thereby defining the channel region of the aforementioned MOS transistor. Generally, a lightly doped drain (LDD) structure is also formed in the memory or logic device of a miniaturized MOS transistor. The LDD source/drain region is commonly fabricated in two steps. First, implantation using a light ion concentration is self-aligned with the polysilicon gate electrode 14. Subsequently, an oxide layer is deposited using a chemical vapor deposition (CVD) method, then the oxide layer is etched back anisotropically to expose the desired heavily doped drain region while forming insulating sidewall spacers 20 on the gate electrode. Next, a self-aligned ion implantation is again carried out, this time using a high ion concentration to form the source/drain region 22 and 24.

Thereafter, an insulating layer 26 such as oxide is formed above the aforementioned MOS substrate wafer, for example, using a chemical vapor deposition method. Subsequently, using photolithographic and etching processes, the insulating layer 26 is patterned and etched to form a contact window 27 exposing the source/drain region 22.

Next, as shown in FIG. 1B, a metal suicide layer 28 is formed over the exposed source/drain region 22 and the insulating layer 26 serving as the lower electrode of the charge storage structure. The metal silicide can be tungsten suicide $WSi_x$. Conventionally, tungsten silicide is deposited over the polysilicon using a low pressure chemical vapor deposition (LPCVD) method. In the deposition of tungsten silicide, tungsten hexafluoride is used as the source gas and reacts with silane ($SiH_4$) at a temperature of between 300° C. to 400° C. and an operating pressure of about 0.3 to 1.0 torr. The deposited tungsten suicide $WSi_x$ has a x value ranging between 2.6 to 2.8. Hence, an annealing operation is required to lower the resistance of tungsten silicide, and prevented too much RC time delay, which will affect the switching frequency of the MOS device. After the annealing operation, the value of x in $WSi_x$ is lowered to between 2.3 to 2.4. Resistivity of the tungsten silicide layer can be lowered from 600–900 $\mu\Omega$-cm to about 35–80 $\mu\Omega$-cm depending on the annealing time and the annealing temperature.

However, the value of x in tungsten silicide layer ($WSi_x$) 28 for the lower electrode of this invention is preferably below 2.2. Therefore, the $WSi_x$ layer formed by the LPCVD process is unsatisfactory for this invention, and a sputtering deposition method should be used. Sputtering deposition operates by bombarding a single target or multiple targets with argon, thereby sputtering metal onto the substrate wafer followed by sintering under high temperature to form suitable metallic compound. If a single target is employed, target material must be a composite compound target. On the other hand, if multiple targets are used, then the target material can be a pure element. Pressure in the sputtering system is normally maintained below $10^{-6}$ torr in order to reduce the activities of residual gases during deposition. Sputtering deposition has a better control over the compounding ratio between metal and silicon, and can provide step coverage better than a co-evaporation method. In some modern sputtering system, distance between the sputtering target and the substrate wafer can even be shortened to increase the deposition rate. After the formation of the tungsten silicide layer, an annealing is still necessary. Under an argon-rich atmosphere and a temperature of about 1000° C. to 1200° C., the deposited tungsten silicide is annealed for about 60 seconds. Through annealing, tungsten silicide layer will be transformed from a silicon-rich tungsten silicide layer into a tungsten-rich tungsten silicide layer having a resistance ten times lower. Thickness of the deposited tungsten silicide layer is preferably about 1000Å to 2000Å.

Next, also shown in FIG. 1B, a nitridation operation is carried out to form a first metal nitride layer 30 above the metal silicide layer 28. If the metal silicide layer is a tungsten silicide layer, then the metal nitride layer 30 will be a tungsten nitride layer. The tungsten nitride layer is formed on a tungsten silicide layer by exposing the tungsten silicide layer to an atmosphere containing gaseous nitrogen ($N_2$) or ammonia ($NH_3$), and then performing a rapid thermal processing (RTP) operation. Using a RTP method to form a tungsten nitride layer not only can lower the thermal budget of the operation, but can also lower the work function of contact interface. The RTP is operated continuously for about 15–60 seconds with the temperature controlled to within 800° C. to 1000° C. Subsequently, a smooth, thin and uniform layer of tungsten nitride layer is obtained. This tungsten nitride layer has very fine grains, therefore, can function as a barrier for the tungsten silicide layer preventing the formation of oxide on the tungsten silicide surface. Hence, the gain of the capacitor is increased and low leakage current can be maintained.

Next, as shown in FIG. 1C a dielectric layer 32 is formed over the metal nitride layer 30. The dielectric layer 32 can be a tantalum oxide layer formed, for example, by using a low pressure chemical vapor deposition (LPCVD) method. For example, $Ta(OC_2H_5)_5$ and oxygen, or $TaCl_5$ and $N_2O$ can be reacted in a reaction chamber, under the optimal plasma-CVD operating conditions, to form a low leakage current tantalum oxide layer having a thickness preferably between 50Å to 140Å. Subsequently, a second metal nitride layer 34 is formed over the dielectric layer 32. The metal nitride layer can be a titanium nitride layer formed by using a CVD deposition method, and functions as an upper electrode for the charge storage structure.

This invention utilizes a tungsten silicide as the lower electrode of the charge storage structure, and using a rapid thermal processing operation to form a smooth and uniform tungsten nitride layer over the tungsten silicide layer. With the tungsten nitride layer serving as a barrier layer, the lowering of capacitance due to the formation of an unnecessary silicon oxide layer on the tungsten silicide surface can be prevented. Furthermore, RTP method not only can lower the thermal budget of the operation, but can also lower the work function of contact interface. In addition, a tantalum oxide dielectric layer is able to increase the capacitance of the charge storage structure. Finally, a titanium nitride layer is formed over the dielectric layer to serve as the upper electrode of the charge storage structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a charge storage structure that can be applied to a substrate wafer having a MOS transistor already formed thereon, wherein an insulating layer has been formed over the substrate wafer, and furthermore, a contact window has been formed in the insulating layer exposing a source/drain region, comprising the steps of:

forming a metal silicide layer in the contact window and over the surface of the insulating layer, wherein the metal silicide layer functions as the lower electrode of the charge storage structure;

forming a first metal nitride layer over the metal silicide layer to protect the metal silicide layer from oxidation;

forming a dielectric layer over the first metal silicide layer; and forming a second metal nitride layer over the dielectric layer, wherein the second metal nitride layer functions as the upper electrode of the charge storage structure.

2. The method of claim 1, wherein the insulating layer is an oxide.

3. The method of claim 1, wherein the step of forming the metal silicide layer includes depositing a tungsten silicide $WSi_x$ such that the x is smaller than 2.2.

4. The method of claim 1, wherein the metal silicide layer has a thickness of about 1000Å to 2000Å.

5. The method of claim 1, wherein the step of forming the first metal nitride layer includes depositing tungsten nitride.

6. The method of claim 5, wherein the step of forming the tungsten nitride layer includes using a rapid thermal processing method.

7. The method of claim 6, wherein the rapid thermal processing operates in an atmosphere of nitrogen at a temperature of about 800° C. to 1000° C. for about 15–60 seconds.

8. The method of claim 1, wherein the step of forming the dielectric layer includes depositing tantalum oxide.

9. The method of claim 8, wherein the step of forming the dielectric layer includes using a low pressure chemical vapor deposition method.

10. The method of claim 8, wherein the thickness of the dielectric layer is about 50Å–140Å.

11. The method of claim 1, wherein the step of forming the second metal nitride layer includes depositing titanium nitride.

12. The method of claim 3, wherein the tungsten silicide $WSi_x$ is deposited by a sputtering deposition method.

13. The method of claim 12, wherein after the tungsten silicide $WSi_x$ is deposited, the deposited tungsten silicide $WSi_x$ layer is annealed.

14. The method of claim 1, wherein the metal silicide layer is formed in direct contact with the source/drain region in the contact window.

* * * * *